United States Patent
Nakamura et al.

(10) Patent No.: US 10,976,355 B2
(45) Date of Patent: Apr. 13, 2021

(54) SHUNT RESISTOR MOUNTING STRUCTURE AND MOUNTING BOARD

(71) Applicant: KOA CORPORATION, Ina (JP)

(72) Inventors: Keishi Nakamura, Nagano (JP); Susumu Toyoda, Nagano (JP)

(73) Assignee: KOA CORPORATION, Nagano (JP)

( * ) Notice: Subject to any disclaimer, the term of this patent is extended or adjusted under 35 U.S.C. 154(b) by 225 days.

(21) Appl. No.: 16/313,381

(22) PCT Filed: May 25, 2017

(86) PCT No.: PCT/JP2017/019499
§ 371 (c)(1),
(2) Date: Dec. 26, 2018

(87) PCT Pub. No.: WO2018/003361
PCT Pub. Date: Jan. 4, 2018

(65) Prior Publication Data
US 2019/0227104 A1    Jul. 25, 2019

(30) Foreign Application Priority Data
Jun. 27, 2016    (JP) .............................. JP2016-126805

(51) Int. Cl.
*G01R 19/00* (2006.01)
*G01R 15/00* (2006.01)

(52) U.S. Cl.
CPC ......... *G01R 19/0092* (2013.01); *G01R 15/00* (2013.01)

(58) Field of Classification Search
USPC ...................... 324/117 H, 117 R, 126, 140 R
See application file for complete search history.

(56) References Cited

U.S. PATENT DOCUMENTS

| | | | |
|---|---|---|---|
| 2003/0020592 A1 | 1/2003 | Hirasawa | |
| 2014/0370754 A1 | 12/2014 | Kameko et al. | |
| 2015/0091551 A1* | 4/2015 | Kanschat | H01C 17/00 324/126 |
| 2016/0124023 A1* | 5/2016 | Sato | G01R 15/146 324/126 |

(Continued)

FOREIGN PATENT DOCUMENTS

| | | |
|---|---|---|
| CN | 104115241 A | 10/2014 |
| CN | 105684105 A | 6/2016 |

(Continued)

OTHER PUBLICATIONS

Office Action in China Application No. 201780035288.8, dated May 25, 2020, 2 pages.

*Primary Examiner* — Vincent Q Nguyen
(74) *Attorney, Agent, or Firm* — Brinks Gilson & Lione (57) ABSTRACT

A shunt resistor mounting structure comprising: a resistor including a pair of terminal portions and adapted to perform current sensing; and a mounting board. The mounting board includes: a mounting portion including a pair of a first land and a second land to which the pair of terminal portions are respectively connected, and which allow a current to be measured to flow through the resistor; a substrate having the pair of lands formed thereon; a first voltage terminal formed on the substrate and including a line pattern led out from the first land; and a second voltage terminal including a wire connected to the terminal portion corresponding to the second land.

4 Claims, 10 Drawing Sheets

(56) References Cited

U.S. PATENT DOCUMENTS

2016/0240288 A1    8/2016  Chiku et al.
2017/0212150 A1*  7/2017  Kang .................... G01R 15/146
2018/0005733 A1*  1/2018  Shinotake .............. G01R 15/00

FOREIGN PATENT DOCUMENTS

JP        2002372551 A    12/2002
JP        20/2233706 A    11/2012

* cited by examiner

SHUNT RESISTOR MOUNTING STRUCTURE AND MOUNTING BOARD

This application is a 371 application of PCT/JP2017/019499 having an international filing date of May 25, 2017, which claim priority to JP2016-126805 filed Jun. 27, 2016, the entire content of each of which is incorporated herein by reference.

TECHNICAL FIELD

The present invention relates to a mounting structure and the like for a shunt resistor for sensing current.

BACKGROUND ART

Conventionally, a current sensing device is known in which a current to be monitored is flowed through a shunt resistor, a voltage between the electrodes at the ends of the resistor is measured, and the current is sensed using a known resistance value. When the current sensing device is used to sense a current flowing through the resistor that includes a high frequency component, a slight parasitic inductance of the resistor introduces an error into the sensed value.

Figure 14:
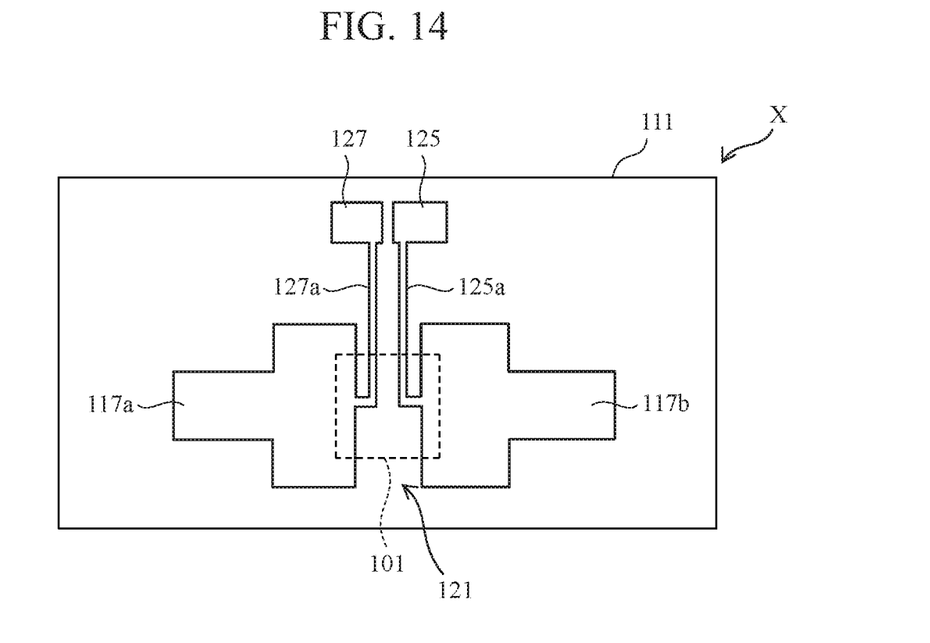
FIG. 14 is a plan view of an example of a general current sensing device.

FIG. 14 is a plan view illustrating an example of a general current sensing device X. The current sensing device X includes a board 111 having disposed thereon: lines (current terminals) 117a, 117b including a first land and a second land; and sensing line patterns 125, 127 (voltage sensing terminals) which are led out from within a gap 121 between the lines 117a, 117b to the outside of the gap 121 by means of lead-out line portions 125a, 127a. The terminals of a shunt resistor 101 are connected to the first land and the second land.

In the above configuration, a parasitic inductance of the resistive element (the length of the resistive element, i.e., electrode to electrode distance) causes a voltage corresponding to a temporal change in the current to be measured, resulting in an error corresponding to the voltage.

Accordingly, in Patent Literature 1, for example, line patterns which are connected to voltage sensing terminals and disposed on a board are arranged in the same direction as the direction of flow of a current to be sensed, and are also provided with a certain length, so that mutual inductance is caused between the line patterns and a resistive element in that portion. In this way, an induced voltage due to the inductance of the resistive element is cancelled, thereby reducing a sensing error caused by the induced voltage of the resistive element as seen from the measuring system.

Patent Literature 2 discloses a resistor mounted structure which includes a board for mounting a shunt resistor, a pair of lands formed on the board and adapted to flow a current through the resistor 1, and a pair of wire connection portions which are formed on the board and connected to the resistor via wires. The pair of wire connection portions are respectively arranged laterally of the resistor between the pair of lands. One wire is connected, over and across a voltage sensing line or an extension thereof to which the other wire is connected, between a voltage sensing position of the resistor and the wire connection portion at the tip of the voltage sensing line.

CITATION LIST

Patent Literature

Patent Literature 1: JP 2002-372551 A
Patent Literature 2: JP 2012-233706 A

SUMMARY OF INVENTION

Technical Problem

However, the technique according to Patent Literature 1 leads to a complex structure and an increase in the number of manufacturing steps.

The technique according to Patent Literature 2 may make it difficult to perform a wire forming step.

An object of the present invention is to provide a shunt resistor mounting structure with which it is possible to suppress, using a relatively simple structure, the influence of parasitic inductance due to the length of a resistive element.

Solution to Problem

According to an aspect of the present invention, there is provided a shunt resistor mounting structure including: a resistor having a pair of terminal portions and adapted to perform current sensing; and a mounting board. The mounting board includes: a mounting portion having a pair of a first land and a second land to which the pair of terminal portions are respectively connected, and which allow a current to be measured to flow through the resistor; a substrate having the pair of lands formed thereon; a first voltage terminal formed on the substrate and connected by a lead-out line portion led out from the first land; and a second voltage terminal connected by a wire from the second land.

By forming the connections between the lands and the voltage terminals using a lead-out line portion for one and a wire for the other, the wiring can be spatially separated.

Preferably, the lead-out line portion and the wire may intersect each other in a plan view of the substrate.

A crossing structure of line patterns can be simply formed, and the loop area of the sensing portion can be reduced.

Preferably, the lead-out line portion may be led out from a side portion of the first land. By leading out from the side portion, a finer pattern can be obtained.

Preferably, the terminals of the resistor may be formed with an alloy plating film.

According to another aspect of the present invention, there is provided a shunt resistor mounting board for mounting a resistor having a pair of terminal portions and adapted to perform current sensing, the mounting board including: a mounting portion including a pair of a first land and a second land to which the pair of terminal portions are respectively connected, and which allow a current to be measured to flow through the resistor; a substrate having the pair of lands formed thereon; a first voltage terminal formed on the substrate and connected by a lead-out line portion led out from the first land; and a second voltage terminal (for connection by wire) formed away from the second land.

The description includes the contents disclosed in Japanese Patent Application No. 2016-126805 from which the present application claims the priority.

Advantageous Effects of Invention

According to the present invention, a shunt resistor mounting structure can be provided with which the influence of parasitic inductance due to the length of a resistive element can be suppressed, using a relatively simple structure.

DETAILED DESCRIPTION OF THE PREFERRED EMBODIMENTS

In the following, with respect to a resistor mounting structure according to an embodiment of the present invention, a shunt resistor will be described by way of example, with reference to the drawings.

A configuration example of the shunt resistor used in the present embodiment will be described.

Figure 1:
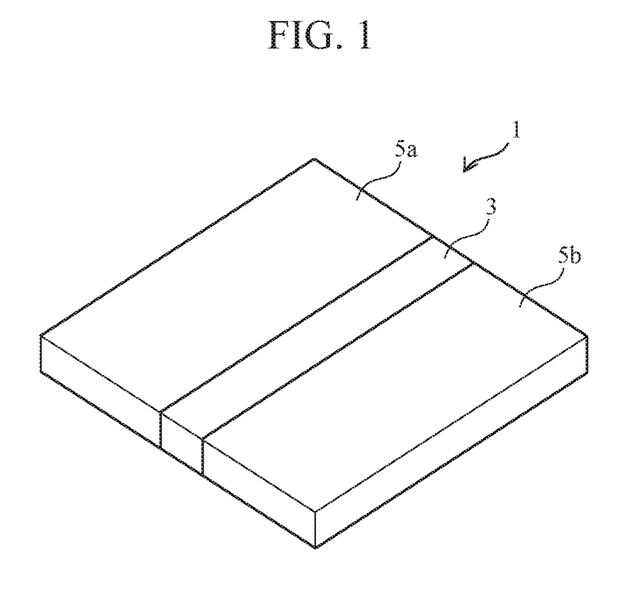
FIG. 1 is a perspective view of a first configuration example of a shunt resistor.

FIG. 1 is a perspective view of a first configuration example of the shunt resistor. The shunt resistor 1 has a butt joint structure in which a resistive element 3 and first and second electrodes (a pair of terminal portions) 5a, 5b are arranged with end surfaces abutting each other, for example. The resistive element 3 may employ a Cu—Ni-based, Ni—Cr-based, or Cu—Mn-based resistive material, for example. The electrodes 5a, 5b may employ a material such as Cu. The resistive element 3 and the electrodes 5a, 5b may be joined by welding using an electron beam, a laser beam and the like, by cladding, or by brazing using a metal nano paste. The shunt resistor may have a product size of 10×10×0.5 (mm), for example, and may have a resistance value of 0.1 mΩ. The shunt resistor 1 may have a structure that consists of the resistive material (i.e., not provided with electrodes of other metal material).

Figure 2:
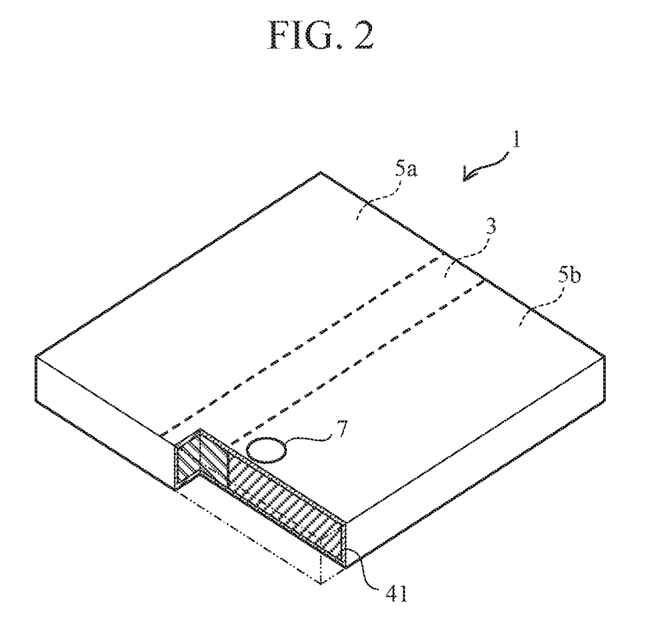
FIG. 2 is a perspective view of a second configuration example of the shunt resistor.

FIG. 2 is a perspective view of a second configuration example of the shunt resistor. The shunt resistor 1 of FIG. 2 has a configuration in which the resistor 1 of FIG. 1 has an entirely plated structure. A plating film 41 may be used for surface treatment for facilitating wire bonding. The plating film 41 comprises alloy plating, such as Ni—P plating or Ni—P—W plating, and may employ a material having a resistivity greater than that of at least the Cu of the electrodes. The plating film 41 is formed by electrolytic plating or electroless plating.

While in FIG. 2, the boundary between the resistive element 3 and the electrode 5b is indicated by a dashed line, the boundary becomes difficult to see after plating is performed. Accordingly, the electrode is provided with a mark 7 near the boundary. The mark 7 is an example of a marking indication for determining the position for wire bonding to be performed in a subsequent step, as will be described later.

In an example of the process to provide the mark, the electrode 5b is initially provided with a dent using a punch and the like. Then, the plating film 41 is formed, thereby leaving the dent as a marker.

Figure 3:
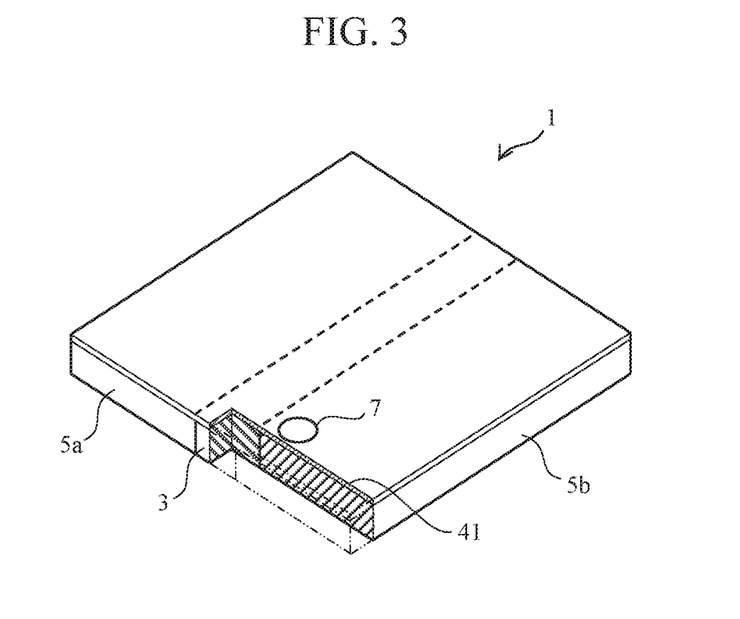
FIG. 3 is a perspective view of a third configuration example of the shunt resistor.

FIG. 3 is a perspective view of a third configuration example of the shunt resistor. The shunt resistor 1 of FIG. 3 has a configuration in which only the upper surface of the shunt resistor 1 is plated, for example. That is, the plating film 41 is not provided on the side surfaces or the lower surface. Because the upper surface is provided with the plating film 41, the mark 7 can be formed on the upper surface as an effective marker for positioning during wire bonding.

Figure 4:
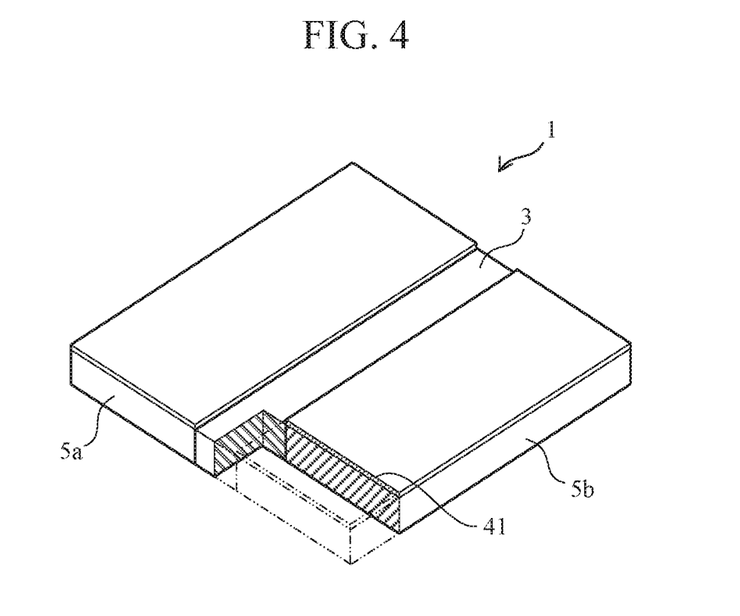
FIG. 4 is a perspective view of a fourth configuration example of the shunt resistor.

FIG. 4 is a perspective view of a fourth configuration example of the shunt resistor. The shunt resistor 1 of FIG. 4 has a configuration in which only the upper surfaces of the electrodes 5a, 5b are plated, for example. That is, the plating film 41 is not provided on the side surfaces, the lower surface, or the resistive element 3. Because the plating film 41 is provided on the upper surfaces of the electrodes 5a, 5b, a height difference corresponding to the thickness of the plating film 41 serves as a marker. Accordingly, in contrast to FIG. 3, it is possible to easily determine the position for wire bonding even without newly forming a mark.

Figure 5:
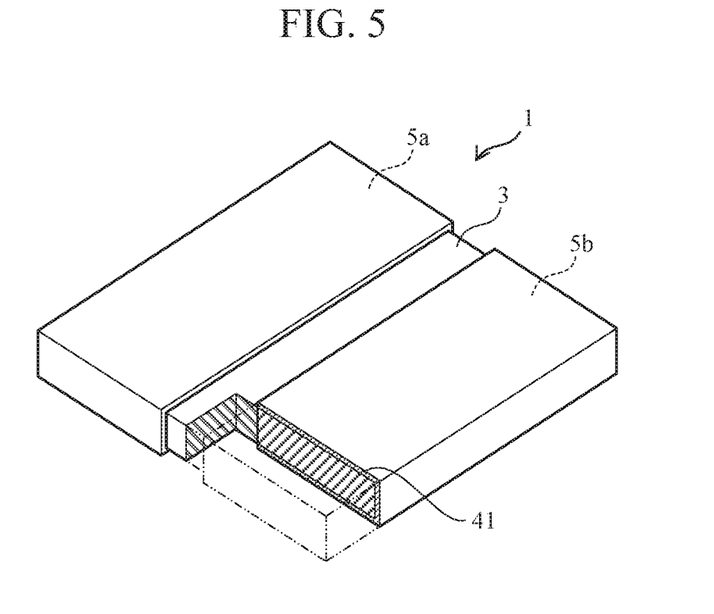
FIG. 5 is a perspective view of a fifth configuration example of the shunt resistor.

FIG. 5 is a perspective view of a fifth configuration example of the shunt resistor. The shunt resistor 1 of FIG. 5 has a configuration in which the exposed portions of the electrodes 5a, 5b are plated, for example. The plating film 41 is not formed on the surface of the resistive element 3.

Because the plating film 41 is provided on the upper surfaces of the electrodes 5a, 5b, the height difference corresponding to the thickness of the plating film 41 serves as a marker. Accordingly, in contrast to FIG. 3, it is also possible in this structure to easily determine the position for wire bonding, even without newly forming a mark.

Variations of the location for plating have been described with reference to FIG. 2 to FIG. 5. However, in terms of achieving the effect of facilitating wire bonding, plating may be provided only in a region including the position for wire bonding or the vicinity thereof.

Figure 6:
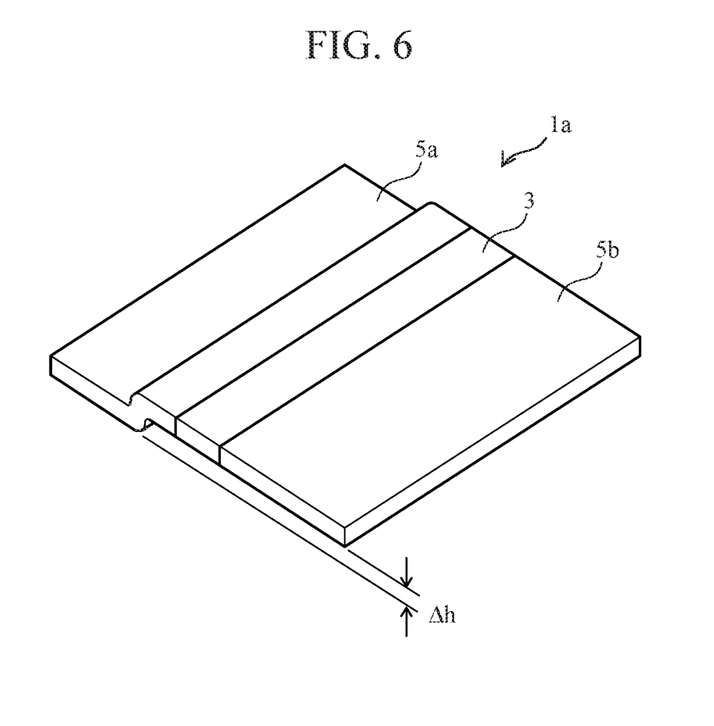
FIG. 6 is a perspective view of a sixth configuration example of the shunt resistor.

FIG. 6 is a perspective view of a sixth configuration example of the shunt resistor. The shunt resistor 1a of FIG. 6 has a configuration in which, for example, one electrode 5a and the other electrode 5b have a height difference Δh. In this example, the height difference is formed by bending the one electrode 5a. The significance of forming the height difference will be described later.

Figure 7A:
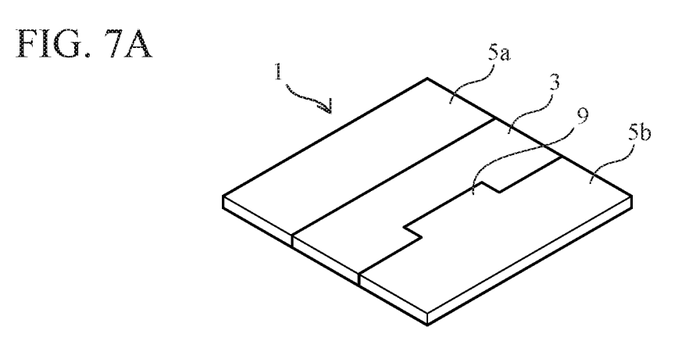
FIG. 7A to FIG. 7D illustrate examples in which the electrodes of a shunt resistor partly protrude on the resistive element side to serve as a marker for a wire bonding position.
Figure 7B:
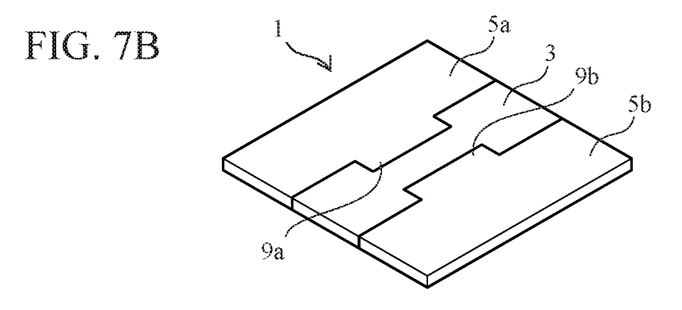
Figure 7C:
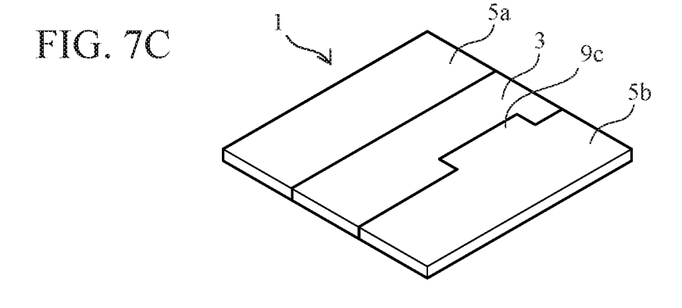
Figure 7D:
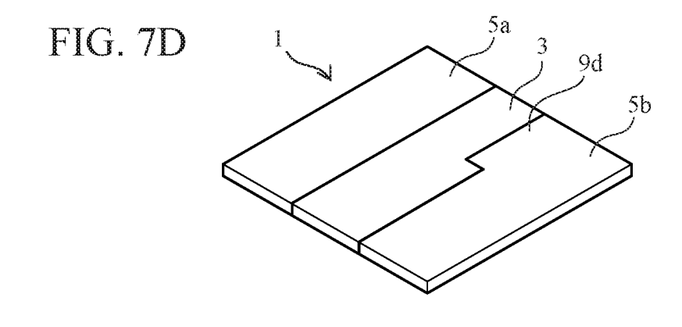

FIG. 7A to FIG. 7D illustrate examples in which the electrodes 5a, 5b of the shunt resistor 1 partly protrude on the resistive element 3 side to provide a marker for the wire bonding position. FIG. 7A illustrates an example in which a protruding portion 9 is only formed in one electrode 5b. FIG. 7B illustrates an example in which protruding portions 9a, 9b are formed in both electrodes 5a, 5b. FIG. 7C is an example in which only one electrode 5b is formed with a protruding portion 9c, where the position of the protruding portion is displaced toward one end in a direction in which the joined portion of the electrode and the resistive element is formed. FIG. 7D illustrates an example in which the protruding portion 9c of FIG. 7C is moved toward one side surface, forming a protruding portion 9d, where one end of the protruding portion 9d and one end of the resistor 1 are aligned.

Thus, it is also possible to provide the marker for the wire bonding position by providing any of the protruding portions 9a to 9d.

The shunt resistor may have a configuration in which the shunt resistor consists of the resistive element and is not provided with the electrode terminals.

The mounting structure for the shunt resistor described above by way of example will be described in detail.

First Embodiment

Figure 8A:
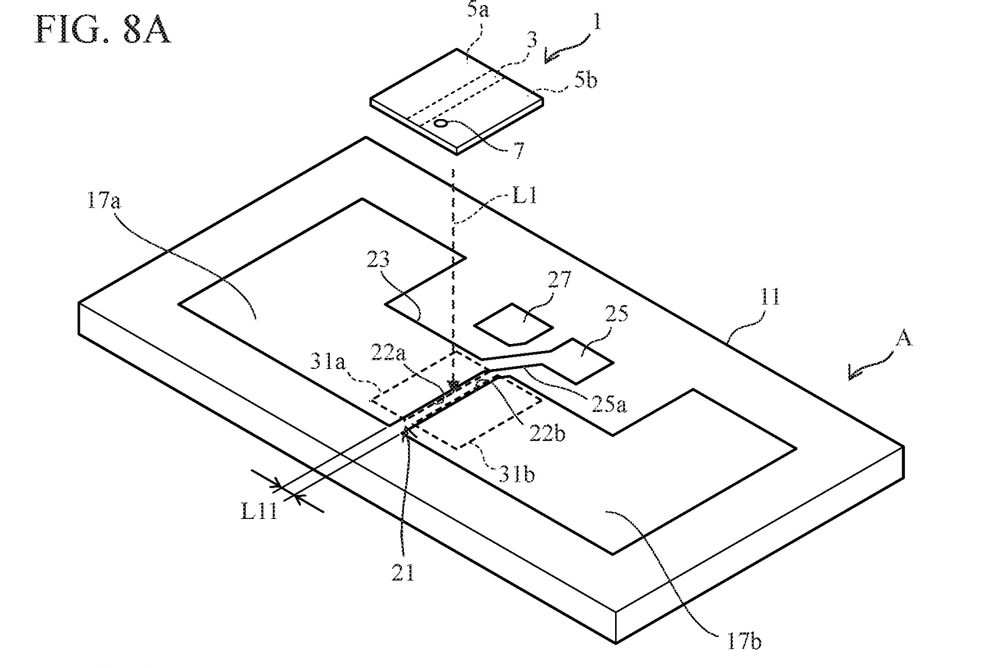
FIGS. 8A and 8B illustrate a configuration example of a shunt resistor mounting structure according to a first embodiment of the present invention.
Figure 8B:
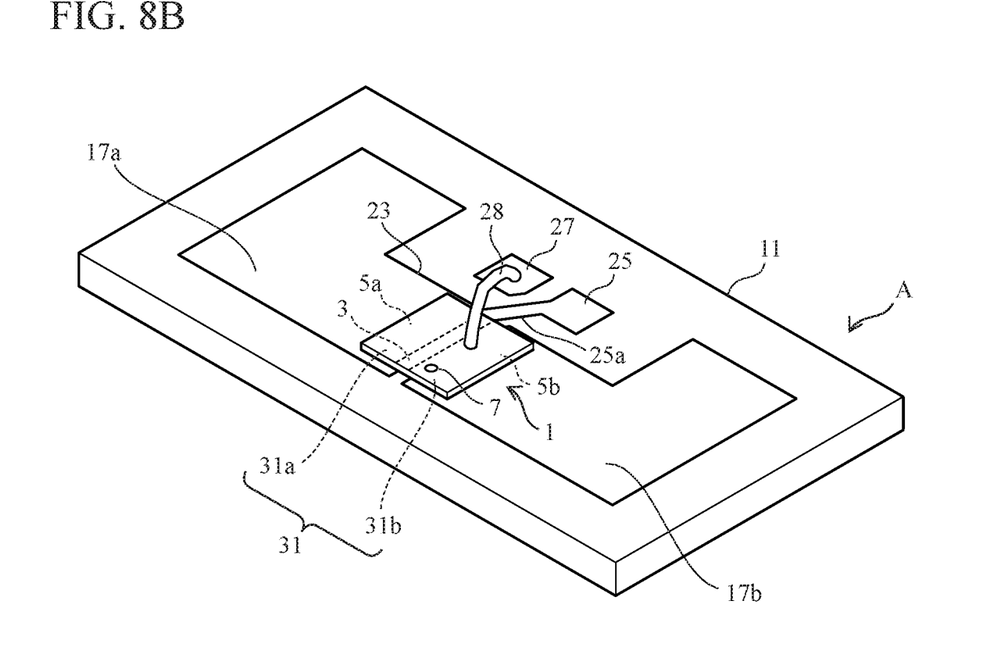

FIG. 8 illustrates a configuration example of the shunt resistor mounting structure according to a first embodiment of the present invention. FIG. 8A is a perspective view illustrating the configuration before the shunt resistor is mounted. FIG. 8B is a perspective view illustrating the configuration after the shunt resistor is mounted.

As illustrated in FIG. 8, the shunt resistor mounting structure according to the present embodiment includes one of the shunt resistors 1 described above with reference to FIG. 1 to FIG. 5 and FIG. 7, and a mounting board A for mounting the shunt resistor 1.

The shunt resistor 1 is a resistor which is provided with, e.g., a pair of terminal portions (first and second electrodes) 5a, 5b described above, and adapted for sensing current.

Figure 9:
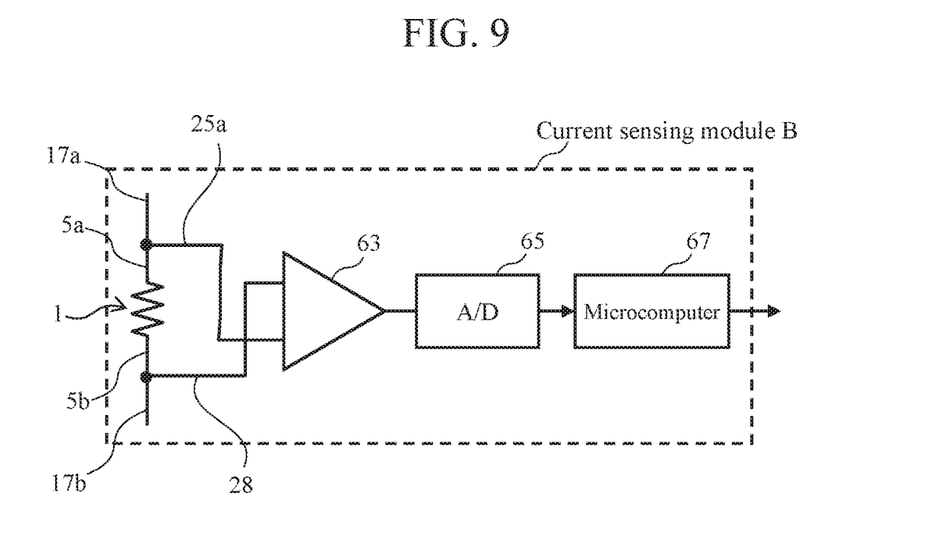
FIG. 9 illustrates an example of a circuit configuration of a shunt resistor mounting structure corresponding to FIG. 8.

FIG. 9 illustrates an example of the circuit configuration of a shunt resistor mounting structure corresponding to FIG. 8.

The mounting structure (current sensing module) B illustrated in FIG. 9 includes, for example, the shunt resistor 1 and the mounting board A illustrated in FIG. 8, which includes (not illustrated in FIG. 8) an amplifier 63 for amplifying a voltage signal between the terminals 5a, 5b of the shunt resistor 1, an A/D converter 65 for A/D converting the signal amplified by the amplifier 63, and a microcomputer 67 for receiving a digital signal output and performing computation.

Upon energization, a voltage value acquired from a lead-out line portion 25a and the wire 28 of the shunt resistor 1 is amplified and converted into digital data, and a current value is computed by the microcomputer 67. The current value is sent to various electric devices via a data bus and the like.

The mounting board A includes a board (substrate) 11 comprising a glass epoxy board, for example, and a first line pattern 17a and a second line pattern 17b which are formed of electrically conductive patterns of copper foil and the like, for example, on one surface of the board 11.

Manufacturing steps will be described briefly.

1) The line patterns of copper foil and the like are formed on one surface of the substrate 11 by etching, for example.

2) Optionally, a resist film and the like may be used to open a mounting region and the like while covering the rest.

3) The resistor is placed (see FIG. 8A, L1), whereby one is wired.

4) The other is connected (wire 28) by wire bonding.

The first line pattern 17a and the second line pattern 17b are respectively electrically connected to the pair of terminal portions 5a, 5b of the shunt resistor 1, so that a current to be measured can flow through the shunt resistor 1. The locations of the line patterns 17a, 17b to which the terminal portions 5a, 5b are connected are herein referred to as a pair of lands 31a, 31b.

The pair of lands 31a, 31b are spaced apart from each other, with a gap 21 of a distance L11 provided between respective proximate end surfaces 22a, 22b thereof opposing each other. A region 31 in FIG. 8B forms a mounting portion for the shunt resistor 1. The pair of lands (first land) 31a, 31b and the pair of electrodes (terminal portions) 5a, 5b of the shunt resistor 1 are respectively connected by soldering and the like.

Further, in the mounting board A, the substrate 11 is provided with: a second voltage terminal 27 disposed at a position which is substantially opposite the first land 31a and spaced apart from a side portion 23 of the first line pattern 17a in a direction in which the gap 21 extends; and a first voltage terminal 25 disposed at a position which is substantially opposite the second land 31b and spaced apart from the side portion 23 of the second line pattern 17b in the direction in which the gap 21 extends.

The substrate 11 is also provided with a lead-out line portion 25a extending diagonally from the first land 31a to the first voltage terminal 25. Further, a wire 28 made of metal, for example, is provided connecting the second land 31b and the second voltage terminal 27. The wire 28 may be formed by wire bonding, for example. The voltage terminals 25, 27 are electrically connected (not illustrated) to the amplifier 63, for example.

As illustrated in FIG. 8B, the lead-out line portion 25a and the wire 28 intersect each other in a plan view of the substrate 11. The wire 28 is disposed above the surface of the substrate 11, so that the lead-out line portion 25a and the wire 28 can be spatially separated from each other in a direction normal to the surface of the substrate 11.

Thus, with the shunt resistor mounting structure according to the present embodiment, it is possible to suppress the influence of parasitic inductance of the resistive element, using a relatively simple structure. The crossing structure of the line patterns can be formed simply, and the loop area of the sensing portion can be reduced, enabling an improvement in current sensing accuracy. One line is provided by board wiring, while the other is provided by wiring using a wire, so that the mounting patterns can also be reduced in size.

In addition, compared to when two locations are wire-bonded, only one location needs to be subjected to wire bonding, thus simplifying the manufacturing process.

Second Embodiment

Figure 10A:
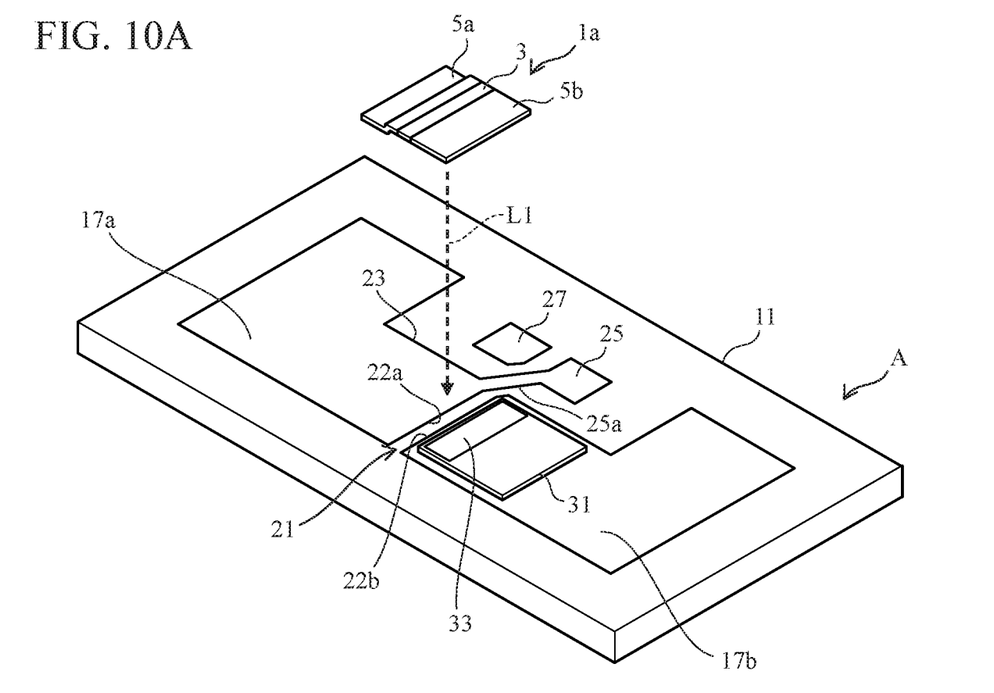
FIGS. 10A and 10B illustrate a shunt resistor mounting structure according to a second embodiment of the present invention, corresponding to FIGS. 8A and 8B.
Figure 10B:
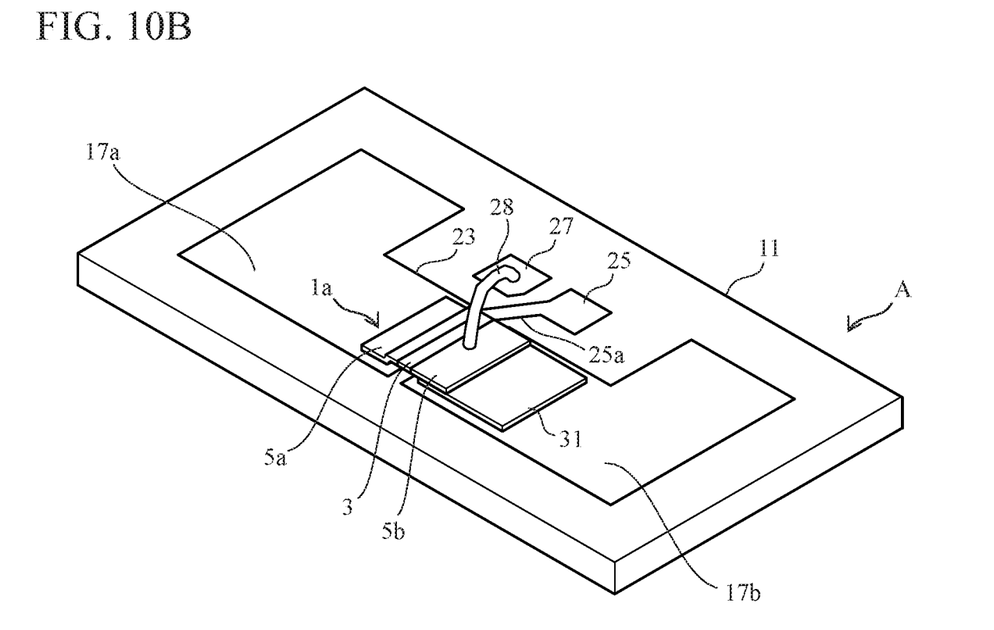

The shunt resistor mounting structure according to a second embodiment of the present invention will be described. FIGS. 10A and 10B illustrate the shunt resistor mounting structure according to the present embodiment, respectively corresponding to FIGS. 8A and 8B.

FIG. 8 and FIG. 10 differ in that on the mounting board A of the mounting structure illustrated in FIG. 10, an electronic component 31, such as a semiconductor component or a metal component (including a resistive element and the like), is mounted on the second line pattern 17b.

When the shunt resistor is mounted on the mounting board A, the shunt resistor 1a illustrated in FIG. 6 may be used. One terminal 5b of the shunt resistor 1a is connected to a region 33 on the electronic component 31 side by soldering, for example. As also illustrated in FIG. 6, by substantially matching the height difference ($\Delta h$) between one electrode 5a and the other electrode 5b of the shunt resistor 1a with the thickness of the electronic component, it becomes possible to arrange the shunt resistor 1a horizontally with respect to a major surface of the mounting board A. The effect of suppressing the influence of parasitic inductance of the resistive element is the same as in the first embodiment.

Summary of Advantages of First and Second Embodiments

Figure 11A:
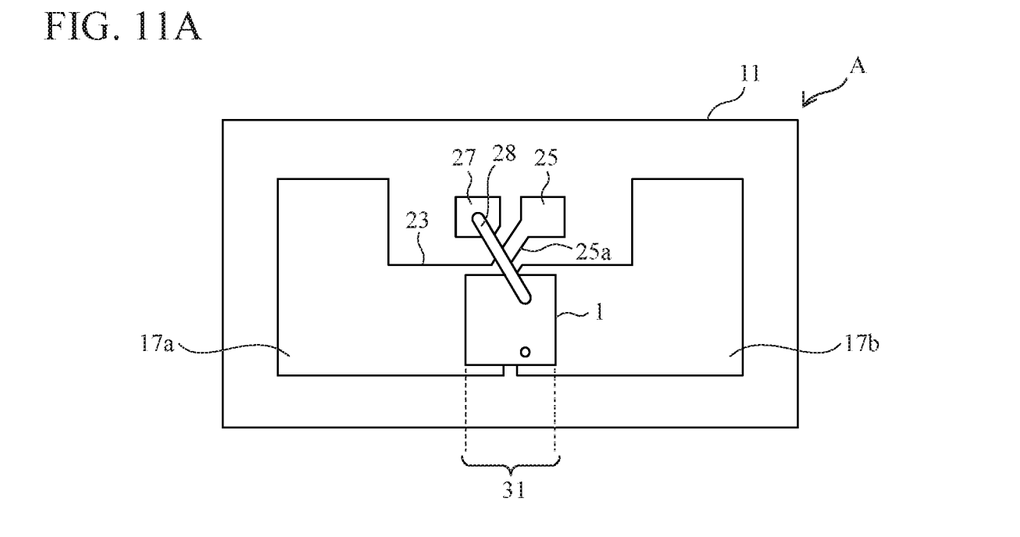
FIGS. 11A and 11B show plan views comparatively illustrating a mounting structure according to the first or the second embodiment (FIG. 11A), and a general mounting structure (FIG. 11B).
Figure 11B:
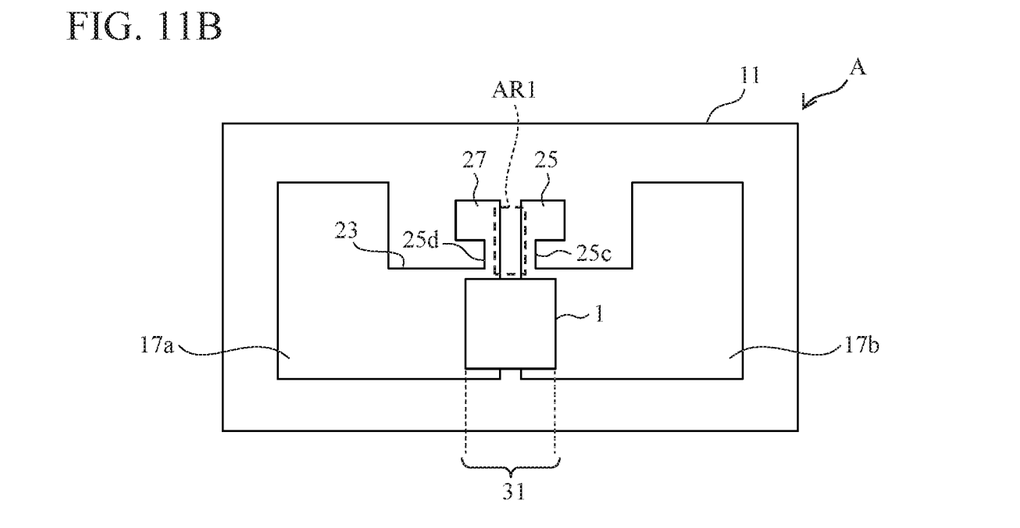

FIG. 11 shows plan views comparatively illustrating the mounting structure according to the first or the second embodiment (FIG. 11A) and a general mounting structure (FIG. 11B). In the mounting structure illustrated in FIG. 11B, the first voltage terminal 25 and the second voltage terminal 27 are respectively led out from the first line pattern 17a and the second line pattern 17b by means of lead-out line portions 25c, 25d. Accordingly, a measurement error due to a magnetic flux inductance generated in a region indicated by sign AR1 cannot be disregarded.

Comparing FIG. 11A with FIG. 11B, in the structure of FIG. 11A corresponding to the present embodiment, the lead-out lines intersect each other in a spatially separated manner. In this way, the measurement error due to the magnetic flux inductance can be suppressed.

Third Embodiment

The shunt resistor mounting structure according to a third embodiment of the present invention will be described.

Figure 12:
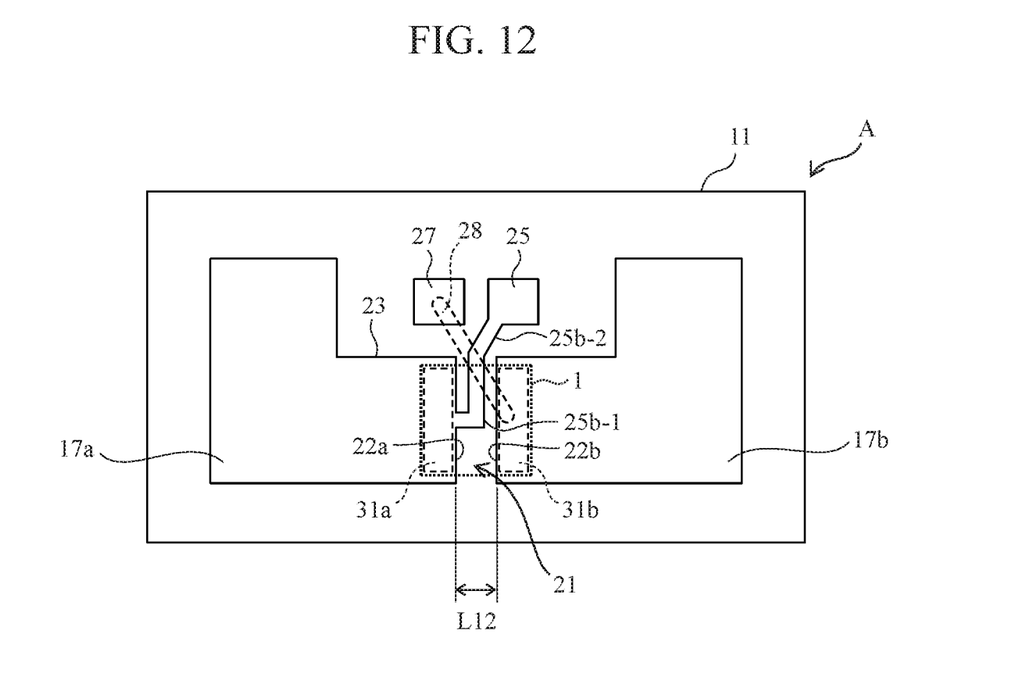
FIG. 12 is a plan view of an example of a shunt resistor mounting structure according to a third embodiment of the present invention.

FIG. 12 is a plan view of an example of the shunt resistor mounting structure according to the present embodiment.

As will be seen by comparing with FIG. 8, in the mounting structure illustrated in FIG. 12, a lead-out line portion 25b connecting the first land 31a and the first voltage terminal 25 includes a first section 25b-1 substantially parallel with the end surface 22a, and a diagonally extending second section 25b-2. The first section 25b-1 may be extended to where the gap 21 ends.

In the structure illustrated in FIG. 12, compared to the structure illustrated in FIG. 8, the diagonally extending section of the lead-out line portion can be made shorter. Accordingly, the length L12 of the gap can be made narrower compared to that which is conventional. Thus, according to the present embodiment, a mounting structure which is finer than is conventional can be obtained.

Fourth Embodiment

The shunt resistor mounting structure according to a fourth embodiment of the present invention will be described.

Figure 13:
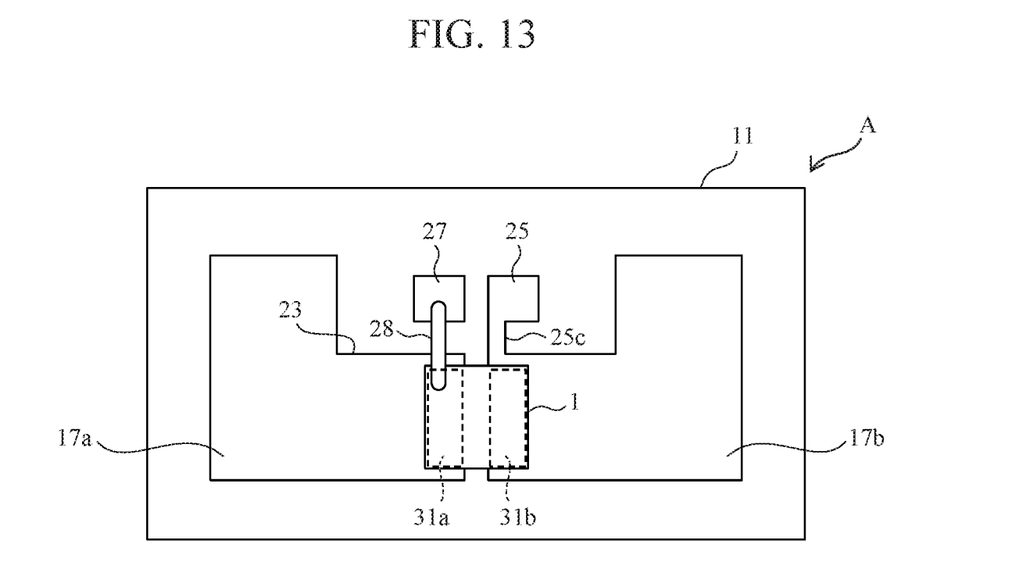
FIG. 13 is a plan view of an example of a shunt resistor mounting structure according to a fourth embodiment of the present invention.

FIG. 13 is a plan view of an example of the shunt resistor mounting structure according to the present embodiment.

As will be seen by comparing with FIG. 8, in FIG. 13, a lead-out line portion 25c extends from the second land 31b to the first voltage terminal 25 in a horizontal direction. Further, the first land 31a and the second voltage terminal 27 are connected by a wire 28 made of metal, for example. As illustrated in FIG. 13, the lead-out line portion 25c and the wire 28 are substantially parallel with each other and do not intersect in a plan view of the substrate 11.

In the present embodiment, the wire 28 can also be spatially separated in a direction normal to the surface of the substrate 11.

Thus, with the shunt resistor mounting structure according to the present embodiment, while the parasitic inductance suppressing effect may be decreased compared to the other embodiments, the interval between the lands 31a, 31b can be made narrower, making it possible to obtain a finer mounting structure.

The foregoing embodiments are not limited to the configurations and the like illustrated in the attached drawings. The configurations and the like may be modified, as appropriate, to the extent that the effects of the present invention can be obtained. The embodiments may be modified and implemented, as appropriate, without departing from the range of the purpose of the present invention.

The constituent elements of the present invention may be optionally selected, and an invention provided with optionally selected configurations is also included in the present invention.

INDUSTRIAL APPLICABILITY

The present invention may be applied in a current sensing device.

All publications, patents and patent applications cited in the present description are incorporated herein by reference in their entirety.

What is claimed is:

1. A shunt resistor mounting structure comprising:
a resistor adapted to perform current sensing, the resistor including a pair of separate first and second terminals and a resistive element electrically connecting the first and second terminals, wherein the resistive element is arranged to flow electrical current across itself in a current flowing direction, and the pair of first and second terminals are each arranged to flow the electrical current across itself in the current flowing direction;
a mounting board having a mounting surface;
a pair of first and second lands both arranged on the mounting surface with a gap for electrical separation between the first and second lands, wherein the resistor is placed so that, the pair of first and second terminals of the resistor are electrically connected to the first and second lands, respectively, and the pair of first and second lands are each arranged to flow the electrical current across itself in the current flowing direction;
a first voltage terminal formed on the mounting surface, wherein the first voltage terminal is electrically connected directly to the first land by a lead-out line running on the mounting surface; and
a second voltage terminal formed on the mounting surface, wherein the second voltage terminal is electrically connected directly to the second terminal of the resistor by a wire bridging above the lead-out line between the second voltage terminal and the second terminal of the resistor.

2. The shunt resistor mounting structure according to claim 1, wherein the lead-out line is configured to run from a side of the first land.

3. The shunt resistor mounting structure according to claim 1, wherein the pair of first and second terminals of the resistor are formed with an alloy plating film.

4. A shunt resistor mounting board for mounting a resistor adapted to perform current sensing the resistor having a pair of separate first and second terminals and a resistive element electrically connecting the first and second terminals, wherein the resistive element flows electrical current through itself in a current flowing direction, and the pair of first and second terminals are each arranged to flow the electrical current across itself in the current flowing direction, the mounting board comprising:

a mounting surface;

a pair of first and second lands both arranged on the mounting surface with a gap for electrical separation between the first and second planar lands, wherein the resistor is placed so that the pair of first and second terminals of the resistor are electrically connected to the first and second lands, respectively, and the pair of first and second lands are each arranged to flow the electrical current across itself in the current flowing direction;

a first voltage terminal formed on the mounting surface, wherein the first voltage terminal is electrically connected directly to the first land by a lead-out line running on the mounting surface; and a second voltage terminal formed on the mounting surface, wherein the second voltage terminal is electrically connected directly to the second terminal of the resistor by a wire bridging above the lead-out line between the second voltage terminal anc the second terminal of the resistor.

* * * * *